United States Patent [19]

Yamauchi

[11] Patent Number: 5,262,986
[45] Date of Patent: Nov. 16, 1993

[54] SEMICONDUCTOR MEMORY DEVICE WITH VOLATILE MEMORY AND NON-VOLATILE MEMORY IN LATCHED ARRANGEMENT

[75] Inventor: Yoshimitsu Yamauchi, Nara, Japan

[73] Assignee: Sharp Kabushiki Kaisha, Osaka, Japan

[21] Appl. No.: 743,893

[22] Filed: Aug. 12, 1991

Related U.S. Application Data

[63] Continuation-in-part of Ser. No. 469,346, Jan. 24, 1990, abandoned.

[30] Foreign Application Priority Data

Jan. 31, 1989 [JP] Japan .................... 1-23551

[51] Int. Cl.$^5$ .................... H01L 29/68; G11C 11/34
[52] U.S. Cl. .................... 365/185; 365/149; 365/129.05; 365/203; 307/530; 257/298; 257/315
[58] Field of Search ........... 365/185, 149, 203, 189.25; 307/530; 357/23.5, 23.6; 257/298, 315

[56] References Cited

U.S. PATENT DOCUMENTS

| | | | |
|---|---|---|---|
| 4,611,309 | 9/1986 | Chaung et al. | 365/185 |
| 4,725,983 | 2/1988 | Terada | 365/185 |
| 4,752,912 | 6/1988 | Guterman | 365/185 |
| 4,813,018 | 3/1989 | Fobayashi et al. | 365/203 |
| 5,075,888 | 12/1991 | Yamauchi et al. | 365/185 |
| 5,140,551 | 8/1992 | Chiu | 365/185 |

FOREIGN PATENT DOCUMENTS

1-204295  8/1989  Japan .................... 365/185

OTHER PUBLICATIONS

Y. Yamauchi et al., "A Novel Nuram CELL . . . ," Technical Digest International Electronc Devices Meeting 1988 San Francisco, Calif. Dec. 11–14, 1988.

Primary Examiner—Joseph E. Clawson, Jr.

[57] ABSTRACT

A semiconductor memory device has memory cells where each cell is constructed with a volatile memory and a non-volatile memory. The semiconductor memory device has a non-volatile memory initializing mode in which the data in the non-volatile memory is erased and a temporary latch by a sense amplifier of data in the volatile memory is done during the nonvolatile memory initializing mode. Initialization of the non-volatile memory is achieved by injecting electrons into the non-volatile memory. If sufficient electrons are present in the non-volatile memory when the non-volatile memory initializing mode is required, it is not necessary to inject electrons. After the non-volatile memory is initialized, new data is written to the non-volatile memory via the volatile memory by injecting holes into the non-volatile memory in an EEPROM mode.

19 Claims, 2 Drawing Sheets

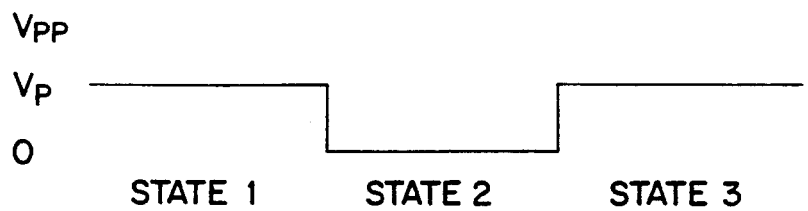
FIG.2(a) BUS T
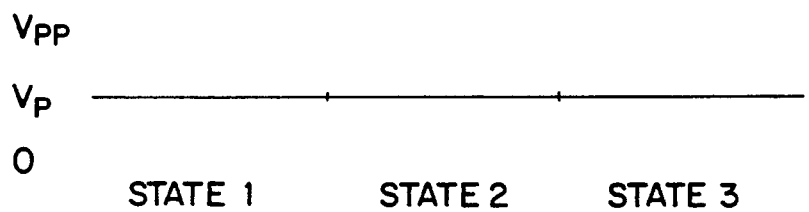
FIG.2(b) BUS W
FIG.2(c) BUS C
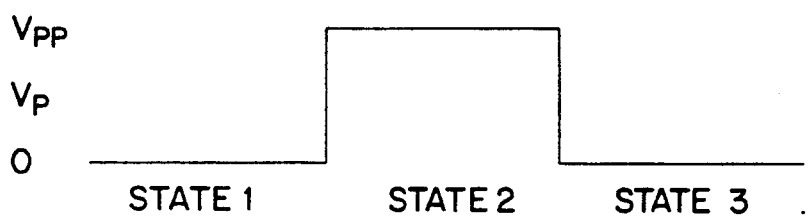
FIG.2(d) BUS M
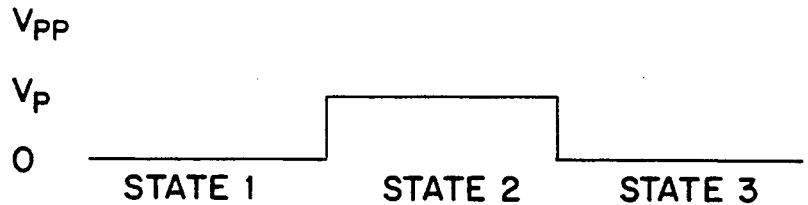
FIG.2(e) BUS U
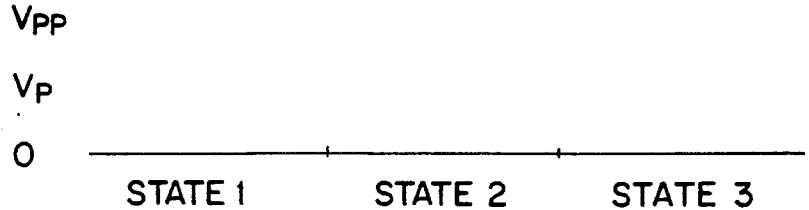
FIG.2(f) BUS E

SEMICONDUCTOR MEMORY DEVICE WITH VOLATILE MEMORY AND NON-VOLATILE MEMORY IN LATCHED ARRANGEMENT

This application is a continuation-in-part of application Ser. No. 07/469,346 filed on Jan. 24, 1990 abandoned.

BACKGROUND OF THE INVENTION

The present invention relates to a semiconductor memory device in which volatile and non-volatile semiconductor memories are combined.

Recently, the inventor of the present invention and other have proposed a semiconductor memory device of such a type in a U.S. patent application Ser. No. 07/308,854 U.S. Pat. No. 5,075,888. The semiconductor memory device is constructed with a DRAM (dynamic random access memory) which is a volatile semiconductor memory, an EEPROM (electrically erasable/-programmable read only memory) which is a non-volatile semiconductor memory, and a mode selector transistor for selecting between the DRAM mode in which the memory device functions as a DRAM and the EEPROM mode in which the memory device functions as an EEPROM. The DRAM typically has a MOS (metal oxide semiconductor) transistor having a gate terminal connected to a word line and a drain terminal connected to a bit line, a sense amplifier, and a capacitor. The EEPROM includes a MOS transistor having a control gate and a floating gate. In this semiconductor memory device, the three transistors are connected successively in series, and one terminal of the capacitor is connected between the MOS transistors of the DRAM and EEPROM. Furthermore, the control gate of the EEPROM and the gate of the mode selector transistor are linked to form a single gate terminal. When a specified voltage is applied to the other terminal of the capacitor or to the linked gate terminal, the accumulated charge in the floating gate of the MOS transistor in the EEPROM is changed, the data in the DRAM is transferred to the EEPROM, and the memory mode of the semiconductor memory device is thus changed.

However, in this semiconductor memory device, when the data in the EEPROM is required to be initialized, that is, when the data in the EEPROM is required to be set to a predetermined initial value of "1" or "0" irrespective of the data in the DRAM, the data held by the DRAM capacitor is destroyed because the applied charge also travels through the DRAM, which is connected to the EEPROM in series. In other words, when the data stored in the DRAM is destroyed before the EEPROM is erased.

SUMMARY OF THE INVENTION

Therefore, it is an object of the present invention to provide a semiconductor memory device which can erase data in the non-volatile semiconductor memory for initialization of the non-volatile semiconductor memory, independently of the data in the volatile semiconductor memory and without destroying the data in the volatile semiconductor memory.

In order to accomplish the above object, the semiconductor memory device of the present invention has a semiconductor memory device comprising, volatile semiconductor memory means, non-volatile semiconductor memory means in series so that data to be stored in the non-volatile semiconductor memory means is transferred thereto through said volatile semiconductor memory means.

The device further comprises a sense amplifier connected to said volatile semiconductor memory means for latching data from said volatile semiconductor memory means in a non-volatile memory initializing mode in which said non-volatile semiconductor memory means is initialized, and a switch provided between said volatile semiconductor memory means and said sense amplifier, and switch control means for controlling the connection between said volatile semiconductor memory means and said sense amplifier in said non-volatile memory initializing mode, said switch connecting said volatile semiconductor memory means and said sense amplifier in response to said switch control means both before initialization of data in said non-volatile semiconductor memory means is started so that data currently stored in said volatile semiconductor memory is transferred to said sense amplifier and after the initialization of data in said non-volatile semiconductor memory means is completed so that the data in said sense amplifier is returned to said volatile semiconductor memory means.

If the switch means is closed or brought into an ON-state, before the data in the non-volatile semiconductor memory is erased, the data stored in the volatile semiconductor memory is transferred to the sense amplifier and is temporarily held by the sense amplifier. When the switch means is next opened, the data in the non-volatile semiconductor memory can be erased with no relationship to the data in the volatile semiconductor memory. After the data in the non-volatile semiconductor memory is thus erased, the data latched by the sense amplifier can then be sent back to the volatile semiconductor memory to the state before the non-volatile semiconductor memory was erased. Thus, the data in the volatile semiconductor memory is not erased before the data in the non-volatile semiconductor memory is erased.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIGS. 2(a)-2(f) illustrate timing diagrams for the control signals of the semiconductor memory device according to the present invention.

DETAILED DESCRIPTION OF THE PREFERRED EMBODIMENTS

Figure 1:
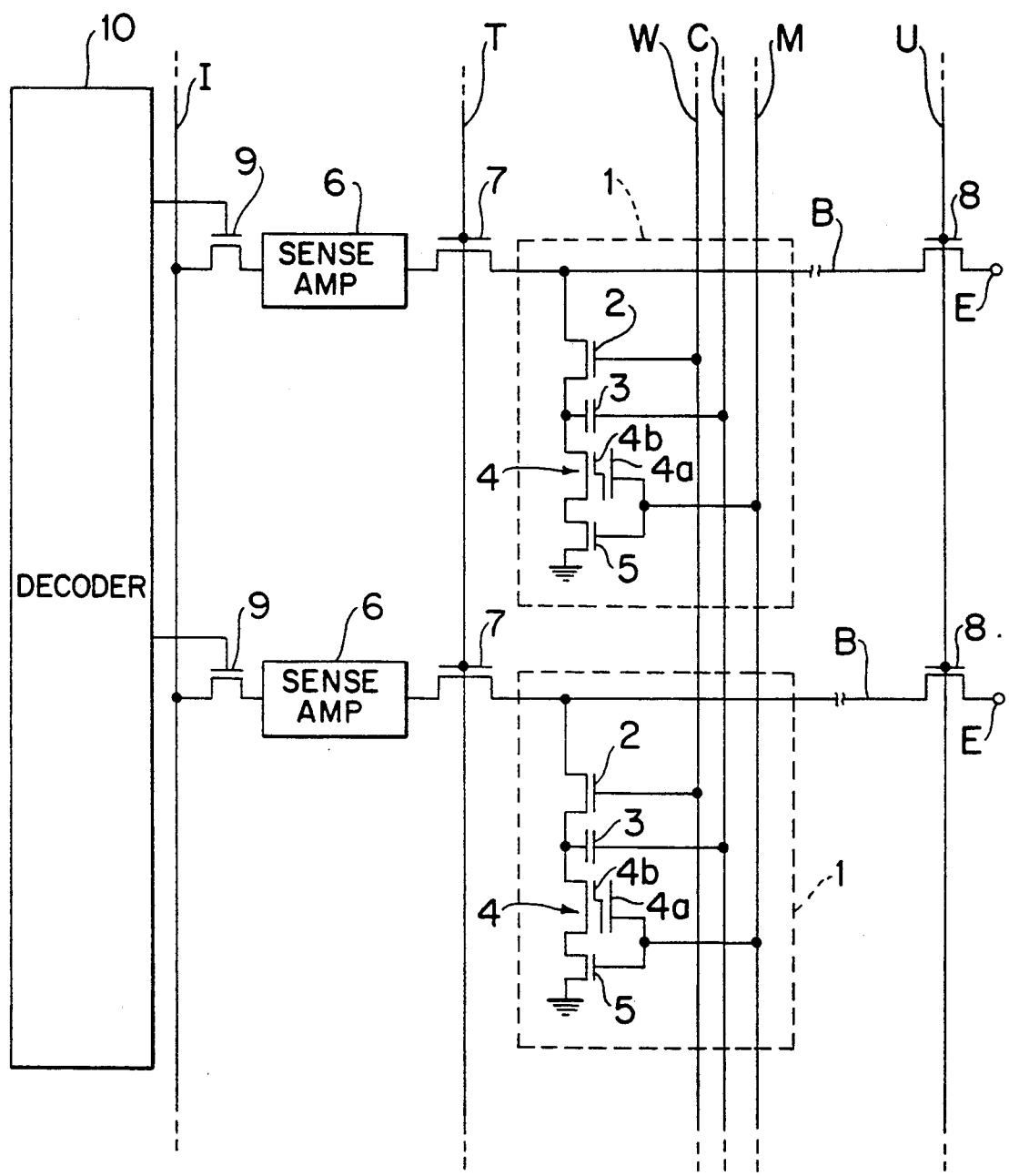
FIG. 1 illustrates an equivalent circuit of a preferred embodiment of the semiconductor memory device according to the present invention.

An equivalent circuit of a semiconductor memory device according to the present invention is illustrated in FIG. 1. In FIG. 1, a memory cell is generally indicated by a reference numeral 1. The semiconductor memory device has a plurality of memory cells 1, but only two of the memory cells are illustrated in the figure for the sake of simplification. Each of the memory cells 1 has a DRAM, an EEPROM, and a mode selector transistor 5. The DRAM includes a word line selector MOS transistor 2 having a gate terminal connected to a word line W and a drain terminal connected to a bit line B, and a capacitor 3. The EEPROM includes a MOS transistor 4 having a control gate 4a and a floating gate 4b. The mode selector transistor 5 controls the memory mode of the semiconductor memory device between either the DRAM mode or the EEPROM mode. In addition to these two memory modes, this semiconductor memory device has an EEPROM initializing mode in which the EEPROM is initialized. This EEPROM initializing mode precedes the EEPROM mode. Data in the DRAM is written to the EEPROM in the EEPROM mode.

The three transistors 2, 4, 5 are connected in series in this order, and the source terminal of the mode selector transistor 5 is grounded. One terminal of the capacitor 3 is connected between the MOS transistor 2 and the other MOS transistor 4, and the other terminal of the capacitor 3 is connected to a capacity gate line C. At one end of the bit line B is connected a sense amplifier 6, and between the sense amplifier 6 and the drain terminal of the MOS transistor 2 is connected a MOS transistor 7 that functions as a switch. The gate terminal of the MOS transistor 7 is connected to a switch control line T. At the other end of the bit line B on the terminal E side is connected a MOS transistor 8 having a gate terminal connected to a switch control line U. The control gate 4a of the MOS transistor 4 and the gate of the mode selector transistor 5 are linked to form a single gate terminal which is connected to a gate control line M. An accumulated charge at the floating gate 4b of the MOS transistor 4 is changed by applying a specified potential to the capacity gate line C or to the gate control line M, and then the data in the DRAM is sent to the EEPROM. At this time, the storage mode of the semiconductor memory device is changed to the EEPROM mode.

In the data readout operation, required data are latched by the sense amplifier 6. Subsequently addressing is carried out by a decoder 10, so that the MOS transistor 9 is turned on, and the data are read over an input/output line I.

The semiconductor memory device constructed as thus described is able to erase the data in the EEPROM in the EEPROM initializing mode independently and with no effect on the data in the DRAM through the operation as described below.

(1) First, the potential of the switch control line T is set to VP (In this example VP=8 V.), the potential of the word line W is set to Vp (In this example Vp=8 V.), and the capacity gate line C, gate control line M, switch control line U, and the terminal E of the bit line B are set to the ground potential, so that the MOS transistors 2 and 7 are turned on and the MOS transistor 8 is turned off. Thus, the data in the DRAM, specifically the potential stored in the capacitor 3, is sent via the MOS transistors 2 and 7 to the sense amplifier 6 and the data is latched by the sense amplifier 6.

In the following description it shall be assumed in (2) through (3) below that the capacity gate line C and the terminal E of the bit line B are set to the ground potential.

(2) Next the potential of the switch control line T is set to the ground potential, the potential of the word line W is set to Vp, the potential of the gate control line M is set to Vpp (Vpp is a specific value satisfying the condition that $10 \text{ V} \leq \text{Vpp} \leq 20 \text{ V}$, and the potential of the switch control line U is set to Vp, so that the MOS transistor 7 is turned off, and the MOS transistor 8 is turned on. The charge accumulated in the floating gate 4b of the MOS transistor 4 is changed according to the value of Vpp. Accordingly, the data in the EEPROM is erased. It is to be noted that initialization of the EEPROM is effected by injecting electrons into the EEPROM. However, if sufficient electrons are present in the EEPROM when the initialization is required, further electrons are not injected. Injection of electrons is done only when the EEPROM is empty of electrons. As a result of this selective injection of electrons, data of the EEPROMs of every memory cell are uniformly set to either "1" or "0". The initialization of the EEPROMs by injecting electrons is well known to those skilled in the art.

(3) Finally, the potential of the switch control line T is set to Vp, the potential of the word line W is set to Vp, the potential of the gate control line 4 is set to ground, and the potential of the switch control U is set to the ground potential, so that the two MOS transistors 2 and 7 are turned on, and the other MOS transistor 8 is turned off. At this time, the data latched by the sense amplifier 6 at step (1) above is returned to the capacitor 3 via the MOS transistors 7 and 2. In other words, the data stored in the DRAM at step (1) above is restored to the DRAM.

The change in potential at T, W, C, M, U, and E in the sequence from step (1) through step (3) above is illustrated in the following Table 1.

TABLE 1

| Bus Sequence | T | W | C | M | U | E |
|---|---|---|---|---|---|---|
| (1) | Vp | Vp | 0 | 0 | 0 | 0 |
| (2) | 0 | Vp | 0 | Vpp | Vp | 0 |
| (3) | Vp | Vp | 0 | 0 | 0 | 0 |

(Vp = 8V, $10V \leq Vpp \leq 20V$)

The present invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor memory device comprising:
   volatile semiconductor memory means;
   non-volatile semiconductor memory means which is connected to said volatile semiconductor memory means in series so that data to be stored in the non-volatile semiconductor memory means is transferred thereto through said volatile semiconductor memory means;
   a sense amplifier connected to said volatile semiconductor memory means for latching data from said volatile semiconductor memory means in a non-volatile memory initializing mode in which data in said non-volatile semiconductor memory means is initialized;
   a first switch provided on a bit line between said volatile semiconductor memory means and said sense amplifier; and
   switch control means for controlling the connection between said volatile semiconductor memory means and said sense amplifier in said non-volatile memory initializing mode, said switch connecting said volatile semiconductor memory means and said sense amplifier in response to said switch control means both before initialization of data in said non-volatile semiconductor memory means is started so that data currently stored in said volatile semiconductor memory is transferred to said sense amplifier and after the initialization of data in said non-volatile semiconductor memory means is completed so that the data in said sense amplifier is returned to said volatile semiconductor memory means.

2. The semiconductor memory device as claimed in claim 1, wherein said volatile semiconductor memory means comprises a single transistor and a single capacitor, and one of the terminals of said capacitor is connected to the non-volatile semiconductor memory means.

3. The semiconductor memory device as claimed in claim 1, further comprising mode selecting means for selecting between a volatile memory mode in which the semiconductor memory device functions as a volatile semiconductor memory and a non-volatile memory mode in which the semiconductor memory device functions as a non-volatile semiconductor memory, wherein said non-volatile semiconductor memory means comprises a first transistor having a floating gate and a first control gate and said mode selecting means comprises a second transistor having a second control gate, said first control gate of said non-volatile semiconductor memory and said second control gate to said mode selecting means being linked together to form a main control gate.

4. The semiconductor memory device as claimed in claim 1, wherein said switch is connected to a bit line and to said sense amplifier.

5. The semiconductor memory device as claimed in claim 1, wherein said volatile semiconductor memory means comprises a DRAM and said non-volatile semiconductor memory means comprises an EEPROM.

6. A semiconductor memory device, comprising:
a plurality of memory cells connected to each of a plurality of bit lines, each of said memory cells including,
volatile semiconductor memory means, and
non-volatile semiconductor memory means connected in series to said volatile semiconductor memory means for storing data transferred from said volatile semiconductor memory means;
a sense amplifier corresponding to said memory cells on each bit line and connected to said volatile semiconductor memory means of each said memory cell for latching data from said volatile semiconductor memory means in a non-volatile memory initializing mode in which data in said non-volatile semiconductor memory means is initialized;
a switch corresponding to said memory cells on each bit line and provided between said volatile semiconductor memory means and said sense amplifier of said memory cells on each bit line; and
switch control means for controlling the connection between said volatile semiconductor memory means and said sense amplifier in said non-volatile memory initializing mode, said switch connecting said volatile semiconductor memory means and said sense amplifier in response to said switch control means both before initialization of data in said non-volatile semiconductor memory means is started so that data currently stored in said volatile semiconductor memory means is transferred to said sense amplifier and after initialization of data in said non-volatile semiconductor memory means is completed so that the data in said sense amplifier is returned to said volatile semiconductor memory means.

7. The semiconductor memory device as claimed in claim 6, wherein said volatile semiconductor memory means comprises a transistor and a capacitor and one of the terminals of said capacitor is connected to said non-volatile semiconductor memory means.

8. The semiconductor memory device as claimed in claim 6, further comprising mode selecting means corresponding to each of said memory cells for selecting between a volatile memory mode in which the semiconductor memory device functions as a volatile semiconductor memory and a non-volatile memory mode in which the semiconductor memory device functions as a non-volatile semiconductor memory, wherein said non-volatile semiconductor memory means comprises a first transistor having a floating gate and a first control gate and said mode selecting means comprises a second transistor having a second control gate being linked together to form a main control gate.

9. The semiconductor memory device as claimed in claim 6, wherein said volatile semiconductor memory means comprises a DRAM and said non-volatile semiconductor memory means comprises an EEPROM.

10. The semiconductor memory device as claimed in claim 1, wherein said switch control means comprises first, second and third control states for said non-volatile memory initializing mode.

11. The semiconductor memory device as claimed in claim 6, wherein said switch control means comprises first, second and third control states for said non-volatile memory initializing mode.

12. The semiconductor memory device as claimed in claim 1, further comprising potential feed means for providing said bit line with an electric potential to be applied to said non-volatile memory means when said first switch fails to connect said volatile semiconductor means and said sense amplifier.

13. The semiconductor memory device as claimed in claim 10, further comprising potential feed means for providing said bit line with an electric potential to be applied to said non-volatile memory means when said first switch fails to connect said volatile semiconductor memory means and said sense amplifier.

14. The semiconductor memory device as claimed in claim 12, wherein said potential feed means comprises a second switch provided on said bit line on a side of said first switch that fails to face said sense amplifier.

15. The semiconductor memory device as claimed in claim 11, further comprising potential feed means for providing said bit line with an electric potential to be applied to said non-volatile memory means when said first switch fails to connect said volatile semiconductor memory means and said sense amplifier.

16. The semiconductor memory device as claimed in claim 14, wherein said switch control means comprises a first switch control line connected with said first switch, wherein the semiconductor memory device further comprises a gate control line connected with said non-volatile memory means and a second switch control line connected with said second switch, and wherein said first switch control line is set to a first voltage level and said second switch control line and said gate control line are set to ground in said first control state, said gate control line is set to a second voltage level higher than that of said first voltage level and said first switch control line is set to ground and said second switch control line is set to said first voltage level in said second control state, and said gate control line and said second switch control line are set to ground and said first switch control line is set to said first voltage level in said third control state.

17. The semiconductor memory device as claimed in claim 15, wherein said switch control means comprises a first switch control line connected with said first switch, wherein the semiconductor memory device further comprises a gate control line connected with said non-volatile memory means and a second switch control line connected with said second switch, and wherein said first switch control line is set to a first voltage level and said second switch control line and said gate control line are set to ground in said first control state, said gate control line is set to a second voltage level higher than that of said first voltage level and said first control line is set to ground and said second switch control line is set to said first voltage level in said second control state, and said gate control line and said second switch control line are set to ground and said first switch control line is set to said first voltage level in said third control state.

18. A method for operating a semiconductor memory device, which includes a plurality of memory cells each having volatile memory means and non-volatile memory means, in a non-volatile memory initializing mode in which data in said non-volatile memory means is initialized, comprising the steps of:
   (a) connecting said volatile memory means and a sense amplifier in a first control state of said non-volatile memory initializing mode so that stored data in said volatile memory means is transferred to the sense amplifier;
   (b) initializing data stored in said non-volatile memory means after disconnecting said volatile memory means from said sense amplifier in a second control state of said non-volatile memory initializing mode so that data in said non-volatile memory means is set to a predetermined initial value irrespective of a value of data of said volatile memory means; and
   (c) connecting said volatile memory means to the sense amplifier in a third control state of said non-volatile memory initializing mode so that the data transferred to the sense amplifier at said step (a) is returned to said volatile memory means.

19. The method as claimed in claim 18, wherein said semiconductor memory device comprises a first switch provided on a bit line for connecting said volatile memory means to said sense amplifier, a second switch provided on said bit line on a side of said first switch that fails to face said sense amplifier for allowing said bit lie to be provided with a potential to be applied to said non-volatile memory means through said volatile memory means, a gate control line connected with said non-volatile memory means, and first and second switch control lines connected with said first and second switches respectively, and wherein said first switch control line is set to a first voltage level and said second switch control line and said gate control line are set to ground in said first control state, said gate control line is set to a second voltage level and said first switch control line is set to ground and said second switch control line is set to said first voltage level in said second control state, and said gate control line and said second switch control line are set to ground and said first switch control line is set to said first voltage level in said third control state.

* * * * *